(12) United States Patent
Liu et al.

(10) Patent No.: US 7,768,108 B2
(45) Date of Patent: Aug. 3, 2010

(54) SEMICONDUCTOR DIE PACKAGE INCLUDING EMBEDDED FLIP CHIP

(75) Inventors: Yong Liu, Scarborough, ME (US); Jeff Ju, Gorham, ME (US); Zhongfa Yuan, Jiangsu (CN); Roger Luo, Shanghai (CN)

(73) Assignee: Fairchild Semiconductor Corporation, South Portland, ME (US)

( * ) Notice: Subject to any disclaimer, the term of this patent is extended or adjusted under 35 U.S.C. 154(b) by 129 days.

(21) Appl. No.: 12/047,028

(22) Filed: Mar. 12, 2008

(65) Prior Publication Data

US 2009/0230537 A1  Sep. 17, 2009

(51) Int. Cl.
*H01L 23/02* (2006.01)

(52) U.S. Cl. .................. 257/678; 438/110; 438/113; 438/114; 257/692; 257/701

(58) Field of Classification Search .............. 257/678, 257/692, 701; 438/110, 113, 114
See application file for complete search history.

(56) References Cited

U.S. PATENT DOCUMENTS

| | | | |
|---|---|---|---|
| 4,731,701 A | 3/1988 | Kuo et al. |
| 4,751,199 A | 6/1988 | Phy |
| 4,772,935 A | 9/1988 | Lawler et al. |
| 4,791,473 A | 12/1988 | Phy |
| 4,796,080 A | 1/1989 | Phy |
| 4,839,717 A | 6/1989 | Phy et al. |
| 4,890,153 A | 12/1989 | Wu |
| 5,327,325 A | 7/1994 | Nicewarner, Jr. et al. |
| 5,646,446 A | 7/1997 | Nicewarner, Jr. et al. |
| 5,776,797 A | 7/1998 | Nicewarner, Jr. et al. |
| 6,133,634 A | 10/2000 | Joshi |
| 6,329,706 B1 | 12/2001 | Nam |
| 6,432,750 B2 | 8/2002 | Jeon et al. |
| 6,489,678 B1 | 12/2002 | Joshi |
| 6,556,750 B2 | 4/2003 | Constantino et al. |
| 6,566,749 B1 | 5/2003 | Joshi et al. |
| 6,574,107 B2 | 6/2003 | Jeon et al. |
| 6,621,152 B2 | 9/2003 | Choi et al. |
| 6,627,991 B1 | 9/2003 | Joshi |

(Continued)

FOREIGN PATENT DOCUMENTS

JP  05-235260 A  6/2003

(Continued)

OTHER PUBLICATIONS

U.S. Appl. No. 11/971,512, Liu, Yong.

(Continued)

*Primary Examiner*—Fernando L Toledo
(74) *Attorney, Agent, or Firm*—Townsend and Townsend and Crew LLP (57) ABSTRACT

A semiconductor die package. The semiconductor die package includes a leadframe structure, a first semiconductor die comprising a first surface attached to a first side of the leadframe structure, and a second semiconductor die attached to a second side of the leadframe structure. The second semiconductor die comprises an integrated circuit die. A housing material is formed over at least a portion of the leadframe structure, the first semiconductor die, and the second semiconductor die. An exterior surface of the molding material is substantially coplanar with the first surface of the semiconductor die.

20 Claims, 6 Drawing Sheets

U.S. PATENT DOCUMENTS

| | | |
|---|---|---|
| 6,645,791 B2 | 11/2003 | Noquil et al. |
| 6,674,157 B2 | 1/2004 | Lang |
| 6,683,375 B2 | 1/2004 | Joshi et al. |
| 6,696,321 B2 | 2/2004 | Joshi |
| 6,720,642 B1 | 4/2004 | Joshi et al. |
| 6,731,003 B2 | 5/2004 | Joshi et al. |
| 6,740,541 B2 | 5/2004 | Rajeev |
| 6,756,689 B2 | 6/2004 | Nam et al. |
| 6,774,465 B2 | 8/2004 | Lee et al. |
| 6,777,767 B2 * | 8/2004 | Badehi ............... 257/432 |
| 6,777,800 B2 | 8/2004 | Madrid et al. |
| 6,806,580 B2 | 10/2004 | Joshi et al. |
| 6,830,959 B2 | 12/2004 | Estacio |
| 6,836,023 B2 | 12/2004 | Joshi et al. |
| 6,867,481 B2 | 3/2005 | Joshi et al. |
| 6,867,489 B1 | 3/2005 | Estacio |
| 6,891,256 B2 | 5/2005 | Joshi et al. |
| 6,891,257 B2 | 5/2005 | Chong et al. |
| 6,893,901 B2 | 5/2005 | Madrid |
| 6,943,434 B2 | 9/2005 | Tangpuz et al. |
| 6,989,588 B2 | 1/2006 | Quinones et al. |
| 6,992,384 B2 | 1/2006 | Joshi |
| 7,022,548 B2 | 4/2006 | Joshi et al. |
| 7,023,077 B2 | 4/2006 | Madrid |
| 7,061,077 B2 | 6/2006 | Joshi |
| 7,061,080 B2 | 6/2006 | Jeun et al. |
| 7,081,666 B2 | 7/2006 | Joshi et al. |
| 7,122,884 B2 | 10/2006 | Cabahug et al. |
| 7,154,168 B2 | 12/2006 | Joshi et al. |
| 7,157,799 B2 | 1/2007 | Noquil et al. |
| 7,196,313 B2 | 3/2007 | Quinones et al. |
| 7,199,461 B2 | 4/2007 | Son et al. |
| 7,208,819 B2 | 4/2007 | Jeun et al. |
| 7,215,011 B2 | 5/2007 | Joshi et al. |
| 7,217,594 B2 | 5/2007 | Manatad |
| 7,242,076 B2 | 7/2007 | Dolan |
| 7,256,479 B2 | 8/2007 | Noquil et al. |
| 7,264,997 B2 * | 9/2007 | Kameyama et al. ......... 438/113 |
| 7,268,414 B2 | 9/2007 | Choi et al. |
| 7,271,497 B2 | 9/2007 | Joshi et al. |
| 7,285,849 B2 | 10/2007 | Cruz et al. |
| 7,315,077 B2 | 1/2008 | Choi et al. |
| 7,332,806 B2 | 2/2008 | Joshi et al. |
| 2003/0042587 A1 * | 3/2003 | Lee .......................... 257/678 |
| 2003/0080398 A1 * | 5/2003 | Badehi ...................... 257/678 |
| 2003/0102489 A1 | 6/2003 | Nam et al. |
| 2007/0045785 A1 | 3/2007 | Noquil |
| 2009/0039484 A1 * | 2/2009 | Mahler et al. ............... 257/676 |

FOREIGN PATENT DOCUMENTS

| | | |
|---|---|---|
| JP | 07-030051 A | 1/2005 |

OTHER PUBLICATIONS

U.S. Appl. No. 11/971,524, Liu, Yong.
U.S. Appl. No. 12/024,847, Liu, Yong.
U.S. Appl. No. 12/046,734, Liu, Yong.
U.S. Appl. No. 12/046,939, Liu, Yong.
U.S. Appl. No. 12/117,547, Liu, Yong.
ON Semiconductor, "NCP360: USP Positive Overvoltage Protection Controller with Internal PMOS FET and Status FLAG," Dec. 2007, Pub No. NCP360/D Rev.3, Semiconductor Components Industries, LLC. (11 pages).
Fairchild Semiconductor, *Portable Solutions*, 2008 (35 pages).

* cited by examiner

SEMICONDUCTOR DIE PACKAGE INCLUDING EMBEDDED FLIP CHIP

CROSS REFERENCE TO RELATED APPLICATIONS

This application is related to U.S. patent application Ser. No. 12/046,939, which is being filed on the same day as the present application, entitled "Semiconductor Die Package Including Multiple Semiconductor Dice", and which is herein incorporated by reference in its entirety for all purposes.

BACKGROUND

Portable devices such as cell phones are proliferating. There is consequently a need for smaller semiconductor die packages with better heat dissipation properties.

One particular area where a small semiconductor die package would be useful is in a circuit, which provides over-voltage protection (OVP) for a connection that includes D+/D– lines. One company, On Semi, produces a semiconductor die package which includes this function (a Vbus OVP function). However, it is a dual co-planar dice package. It does not have a D+/D– connectivity detection function in a stacked dual dice package as in embodiments of the invention.

Embodiments of the invention address the above problems and other problems individually and collectively.

BRIEF SUMMARY

Embodiments of the invention are directed to semiconductor die packages and methods for making the same.

One embodiment of the invention is directed to a semiconductor die package. The semiconductor die package includes a leadframe structure, a first semiconductor die comprising a first surface attached to a first side of the leadframe structure, and a second semiconductor die attached to a second side of the leadframe structure. The second semiconductor die comprises an integrated circuit die. A housing material is formed over at least a portion of the leadframe structure, and protects the first semiconductor die and the second semiconductor die. An exterior surface of the molding material may be substantially coplanar with the first surface of the semiconductor die, and the first surface may be exposed through the molding material.

Another embodiment the invention is directed to a semiconductor die package comprising a first semiconductor die comprising a power transistor, and a second semiconductor die comprising an integrated circuit. The first semiconductor die is configured to detect a USB device. The first semiconductor die and the second semiconductor die are stacked within the semiconductor die package.

Another embodiment of the invention is directed to a method including obtaining a leadframe structure, attaching a first semiconductor die comprising a first surface to a first side of the leadframe structure, and attaching a second semiconductor die to a second side of the leadframe structure. The second semiconductor die comprises an integrated circuit die. The method also includes forming a housing material over at least a portion of the leadframe structure. In the formed semiconductor die package, the exterior surface of the molding material may be substantially coplanar with the first surface of the semiconductor die and the first surface may be exposed through the molding material.

Another embodiment of the invention is directed to a method for making semiconductor die package. The method comprises obtaining a first semiconductor die comprising a power transistor, and stacking a second semiconductor die comprising an integrated circuit on the first semiconductor die, the second semiconductor die being configured to detect a USB device.

These and other embodiments of the invention are described in further detail in the Detailed Description with reference to the Figures.

BRIEF DESCRIPTION OF THE DRAWINGS

In the Figures, like numerals may designate like elements and the descriptions of elements may not be repeated.

DETAILED DESCRIPTION

Embodiments of the invention are directed to a method of designing an electrical interconnection between an integrated circuit (or IC) die and a leadframe structure in a housing such as a molded housing structure. In embodiments of the invention, the leadframe structure can provide both electrical connections and thermal paths for semiconductor dice mounted on it.

Another embodiment of the invention is directed to a method for designing a cavity in a molded housing, where the molded housing houses at least an integrated circuit die and the leadframe structure. A power MOSFET die with solder bumps attached to it may be flip chip attached to the bottom surface defining the cavity. Source and gate connection pad portions in the leadframe structure can be exposed by the molding material at the bottom of the formed cavity.

Embodiments of the invention are also directed to methods of making semiconductor die packages. Such embodiments include methods for attaching a semiconductor die to the bottom of the above-described cavity, and filling a gap between the die and walls forming the cavity with a material such as an underfill material. The underfill material stabilizes the semiconductor die within the cavity.

Embodiments of the invention also provide for a stacked and embedded dice package switch for a cell phone system level application, which can combine an integrated circuit die, and a power transistor die (e.g., a p-channel MOSFET flip chip, which is commercially available from the assignee of the present application). Embodiments of the invention can provide a power protection function for a Vbus pin, and over voltage protection with D+/D− connectivity detection.

A package according to an embodiment of the invention can have a standard industry pin out. An exposed MOSFET drain region can provide both an electrical connect pin (Vout) and a thermal path to the outside environment. In a package according to an embodiment of the invention, multiple thermal paths are designed in the DAP (die attach paddle or pad) of the leadframe structure for additional thermal transfer capability.

Figure 1:
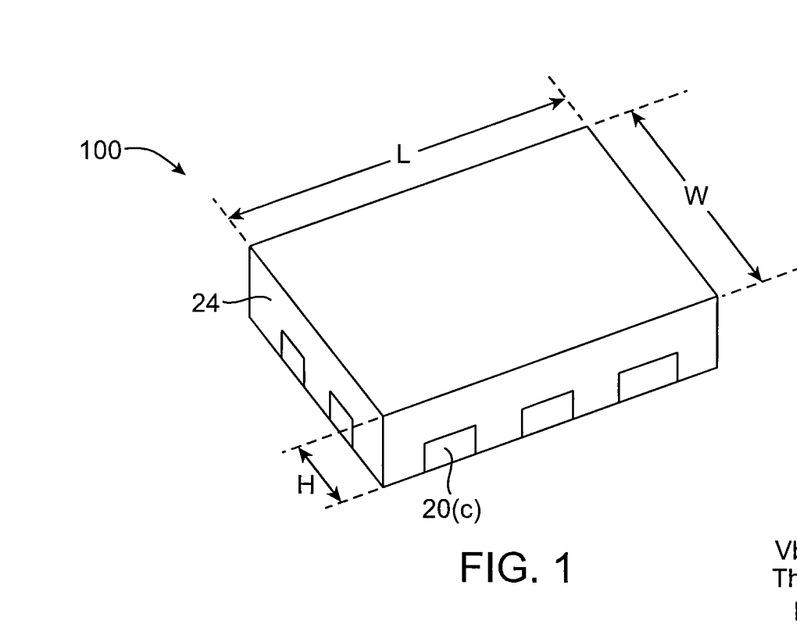
FIG. 1 shows a top perspective view of a semiconductor die package according to an embodiment of the invention.

A top perspective view of a semiconductor die package 100 according to an embodiment of the invention is shown in FIG. 1. The semiconductor die package 100 comprises a length L (e.g., about 2.6 mm), a width W (e.g., about 1.8 mm), and a height H (e.g., 0.7 mm). As shown, the package 100 comprises a molding material 24 covering a leadframe structure. In FIG. 1, leads 20(c) of the leadframe structure are shown. The leads 20(c) do not extend past lateral surfaces of the molding material 24 (e.g., an epoxy molding material), although the leads could extend past lateral surfaces of the molding material 24 in other embodiments of the invention. Although a molding material 24 is discussed in detail herein, it is understood that embodiments of the invention are not limited thereto and that a housing material could be formed using any other suitable process or material.

Figure 2:
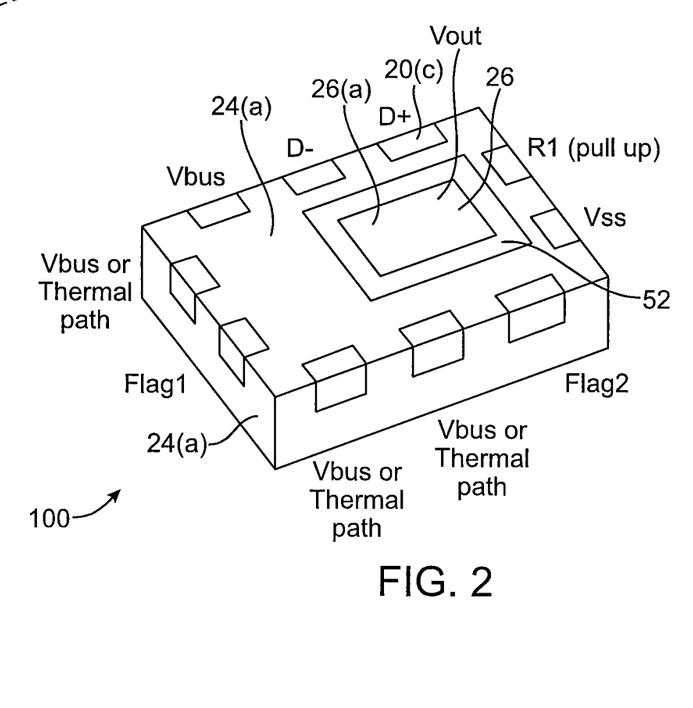
FIG. 2 shows a bottom perspective view of a semiconductor die package according to an embodiment of the invention.

FIG. 2 shows a bottom perspective view of the semiconductor die package 100 shown in FIG. 1. As shown, in FIG. 2, an exterior surface 24(a) of the molding material 24 can be substantially coplanar with, and may expose, a die surface 26(a) of a semiconductor die 26 that is in the semiconductor die package 100. The semiconductor die 26 is at least partially protected by the molding material 24. Because the die surface 26(a) is exposed by the molding material 24, heat generated from the semiconductor die 26 can quickly pass to an underlying circuit board.

An insulating material 52 fills a gap between the die 26 and the molding material 24, and covers the edges of the die 26. The insulating material 52 can comprise an underfill material, such as an epoxy compound, and may be the same or different than the molding material 24.

In this specific embodiment, the leads 20(c) can be designated as follows: Vbus (power input from charger, USB device, or handheld battery), D− (USB data input), D+ (USB data input), R1 (or alternatively LS ctrl or load switch control), Vss (device ground), Flag2 (over/under voltage flag), and Flag 1 (charger/USB device detect flag). The leads 20(c) can additionally or alternatively form thermal paths to the outside environment. The die surface 26(a) may form a Vout (output voltage) connection for the semiconductor die package 100 so that a separate lead for Vout is not needed. This saves a lead so that the saved lead can advantageously be used for some other function.

Figure 3:
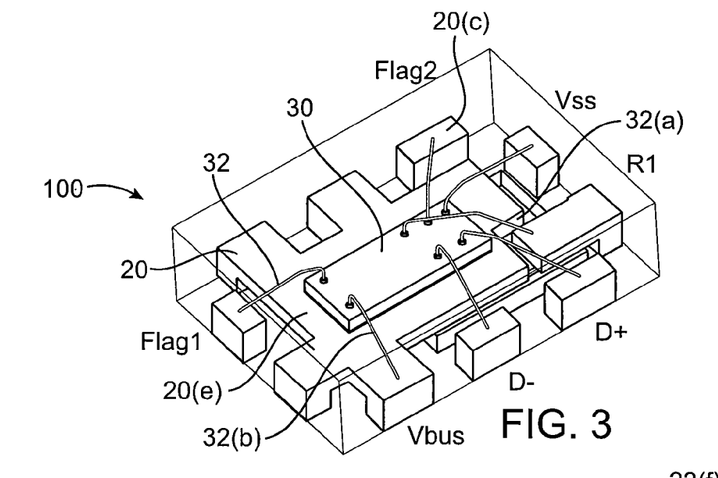
FIG. 3 shows a top perspective view of the semiconductor die package shown in FIG. 1, with inside components of the package being shown.
Figure 4:
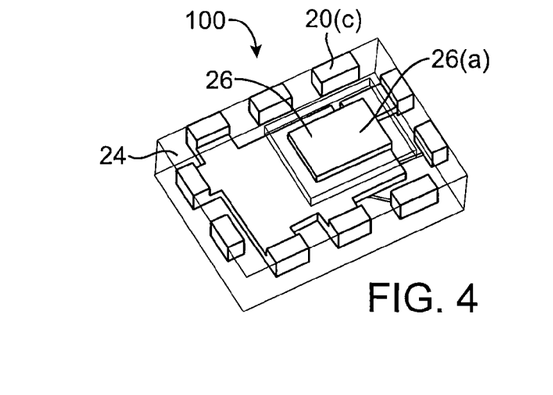
FIG. 4 shows a top perspective view of the semiconductor die package shown in FIG. 1, with inside components of the package being shown.

FIG. 3 shows a top perspective view of the semiconductor die package 100, while FIG. 4 shows a bottom perspective view of the semiconductor die package 100. Inside components in the semiconductor die package 100 are also shown. The semiconductor die package 100 includes a leadframe structure 20, a first semiconductor die 26 comprising a first surface 26(a) attached to a first side of the leadframe structure 20, and a second semiconductor die 30 attached to a second side of the leadframe structure 20. A molding material 24 is formed over and is in contact with at least a portion of the leadframe structure 20, and the second semiconductor die 30.

An exterior surface 24(a) of the molding material 24 is substantially coplanar with the first surface 26(a) of the first semiconductor die 26.

The first semiconductor die 26 may include any suitable semiconductor device. Suitable devices may include vertical or horizontal devices. Vertical devices have at least an input at one side of the die and an output at the other side of the die so that current can flow vertically through the die. Horizontal devices include at least one input at one side of the die and at least one output at the same side of the die so that current flows horizontally through the die. Exemplary vertical power devices are also described in U.S. patent application Ser. Nos. 6,274,905 and 6,351,018, both of which are assigned to the same assignee as the present application, and both of which are herein incorporated by reference in their entirety for all purposes.

Vertical power transistors include VDMOS transistors and vertical bipolar transistors. A VDMOS transistor is a MOSFET that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. Trenched gate structures are preferred, since trenched gate structures are narrower and occupy less space than planar gate structures. During operation, the current flow from the source region to the drain region in a VDMOS device is substantially perpendicular to the die surfaces.

In some embodiments, the first semiconductor die 26 may be a semiconductor die with a discrete device such a power MOSFET. For example, the first semiconductor die 26 may be a P-channel MOSFET die that is commercially available from Fairchild Semiconductor Corp.

The second semiconductor die 30 may comprises an integrated circuit die. An integrated circuit die comprises many electrical devices within the die, and may be configured to perform control or detection functions. For example, the integrated circuit die may be configured to detect the presence of a USB device or a battery charger. An integrated circuit die can be compared to a die with only one discrete device. Various types of integrated circuit dice could be used in other embodiments of the invention.

Figure 5:
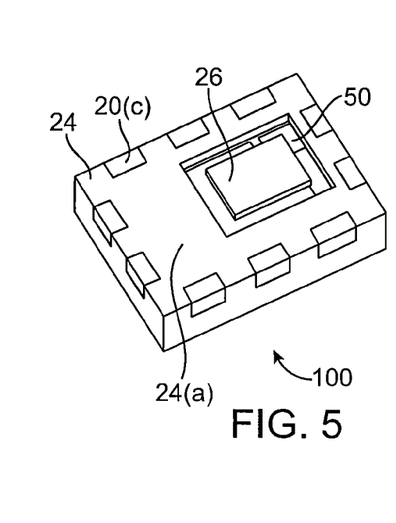
FIG. 5 shows a bottom perspective view of the semiconductor die package without a filling material in a gap between a cavity wall and a semiconductor die.

FIG. 5 shows a top perspective view of the package without the previously described insulating material which fills a gap 50 between the molding material 24 and the first semiconductor die 26. The gap 50 surrounds the edges of the first semiconductor die 50.

Figure 6:
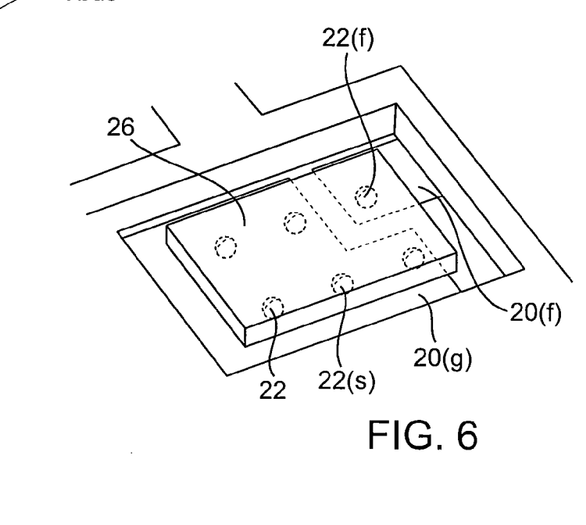
FIG. 6 shows a close-up view of a flip chip that has been placed within a cavity formed at least in part by a housing material.

FIG. 6 shows a close up perspective view of the first semiconductor die 26 being mounted on a gate die attach pad portion 20(f) and a source die attach pad portion 20(g). Source solder balls 22(s) may electrically couple a source region in a MOSFET in the first semiconductor die 26 to the source die attach pad portion 20(g). A gate solder ball 22(f) electrically couples a gate die attach pad portion 20(f) to a gate region in the MOSFET in the first semiconductor die 26.

Referring to FIGS. 3 and 6, the leadframe structure 20 can provide connections between the first semiconductor die 26 and the second semiconductor die 30. For example, source attach pad portion 20(g) can be connected to a source region in the first semiconductor die 26, as well as the Vbus leads in the package 100 and the Vbus terminals in the second semiconductor die 30 via wire 32(b). Wire 32(a) can connect a terminal (e.g., a Flag3 terminal) in the second semiconductor die 30 to the gate die attach portion 20(f) of the leadframe structure 20, and consequently to a gate region in a MOSFET in the first semiconductor die 26.

Figure 7:
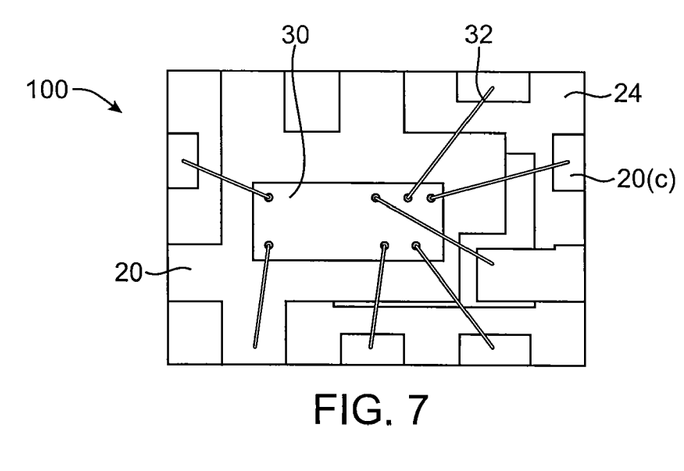
FIG. 7 shows a top plan view of the semiconductor die package shown in FIG. 1.
Figure 8:
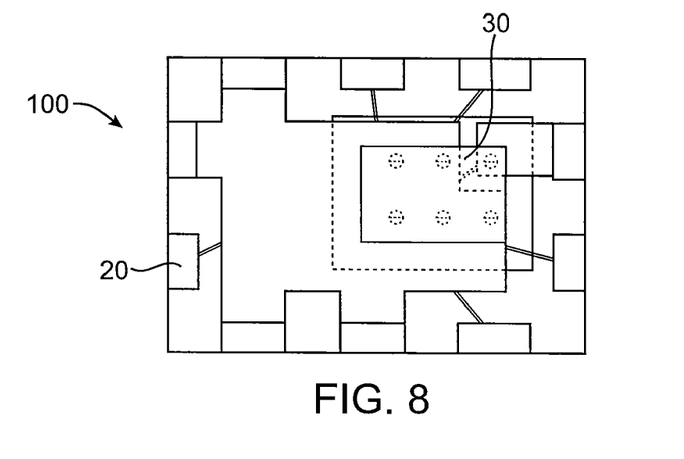
FIG. 8 shows a bottom plan view of the semiconductor die package shown in FIG. 2.
Figure 9:
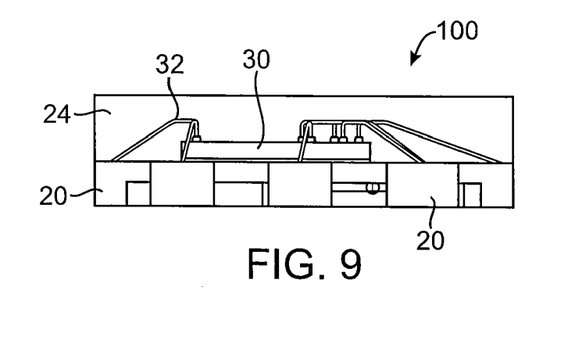
FIGS. 9-10 show side views of the semiconductor die package.
Figure 10:
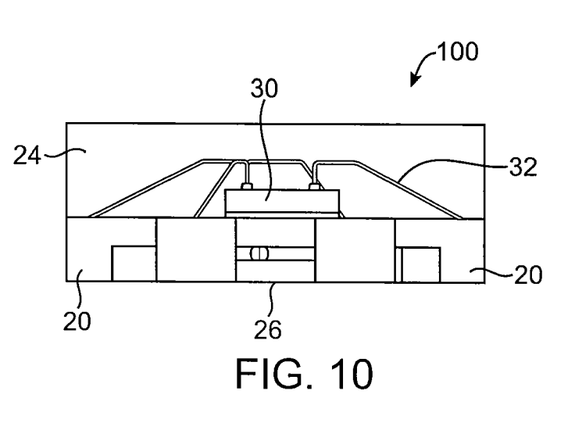

Additional views of the semiconductor die package are shown in FIGS. 7-10. FIG. 7 shows a top plan view of the semiconductor die package shown in FIG. 1. FIG. 8 shows a bottom plan view of the semiconductor die package shown in FIG. 1. FIGS. 9-10 show side views of the semiconductor die package. As shown in FIG. 7-10, the leads 20(c) do not extend past the molding material 24. Also, as shown in FIG. 10, the first and second semiconductor dice 26, 30 are on opposite sides of a leadframe structure 20 and are in a stacked relationship as they overlap with each other.

A method according to an embodiment of the invention can be described with reference to FIGS. 11(a)-11(f). A method according to an embodiment of the invention can include obtaining a leadframe structure, attaching a first semiconductor die comprising a first surface to a first side of the leadframe structure, attaching a second semiconductor die to a second side of the leadframe structure, wherein the second semiconductor die comprises an integrated circuit die, and forming a housing material over at least a portion of the leadframe structure. In the formed semiconductor die package, an exterior surface of the molding material is substantially coplanar with the first surface of the semiconductor die. During this process, the first semiconductor die is stacked on the second semiconductor die, since they attached to opposite sides of a leadframe structure and overlap with each other within the formed semiconductor die package.

Figure 11A:
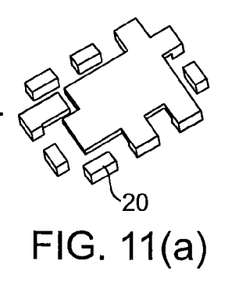
FIGS. 11(a)-11(f) show precursors that are formed during a process of forming a semiconductor die package.

FIG. 11(a) shows a leadframe structure 10. It may be obtained in any suitable manner. For example, it may be manufactured, as explained below, or it may be otherwise obtained from a commercial source.

The term "leadframe structure" can refer to a structure that is derived from or is the same as a leadframe. Each leadframe structure can include two or more leads with lead surfaces and a die attach region. The leads extend laterally from the die attach region. A single lead frame structure may include a gate lead structure, and a source lead structure.

The leadframe structure 20 may comprise any suitable material. Exemplary leadframe structure materials include metals such as copper, aluminum, etc., and alloys thereof. The leadframe structures may also include plated layers such as plated layers of gold, chromium, silver, palladium, nickel, etc. The leadframe structure may also have any suitable thickness, including a thickness less than about 1 mm (e.g., less than about 0.5 mm).

The leadframe structure can be stamped, etched and/or patterned using conventional processes to shape the leads or other portions of the leadframe structure. For example, the leadframe structure can be formed by stamping, and by etching a continuous conductive sheet to form a predetermined pattern. Before or after etching, the leadframe structure can also optionally be stamped so that a die attach surface of the leadframe structure is downset with respect to the lead surfaces of the leads of the leadframe structure. If stamping is used, the leadframe structure may be one of many leadframe structures in an array of leadframe structures that are connected by tie-bars. The leadframe structure array may also be cut to separate the leadframe structures from other leadframe structures. As a result of cutting, portions of a leadframe structure in a final semiconductor die package such as a source lead and a gate lead may be electrically and mechanically uncoupled from each other. Thus, a leadframe structure may be a continuous metallic structure or a discontinuous metallic structure.

Figure 11B:
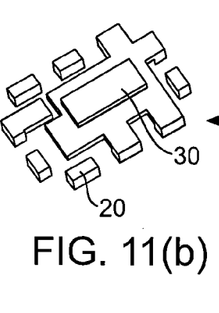

Referring to FIG. 11(b), the second semiconductor die 30 can then be attached to a die attach pad of the leadframe structure. A conductive adhesive (e.g., solder) or non-conductive adhesive may be used to attach the second semiconductor die 30 to the die attach pad of the leadframe structure.

Figure 11C:
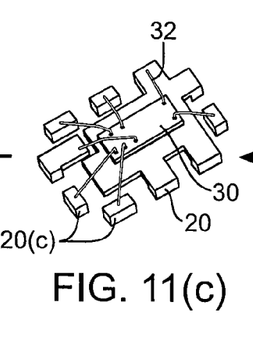
Figure 11D:
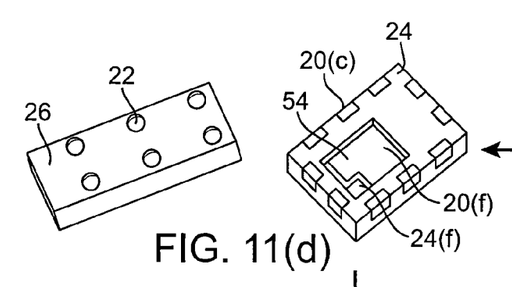

Then, as shown in FIG. 11(c), wirebonds can be formed between the semiconductor die 30 and the leads 20(c) of the leadframe structure 20. The wires 32 may comprise gold, copper, or noble metal coated copper. Conventional wirebonding processes may be used in embodiments of the invention.

Referring to FIG. 11 1(d), a molding material 24 is then formed over the leadframe structure 20 and the second semiconductor die 30. As shown in FIG. 11(d), a cavity 54 is formed after molding. The bottom surface of the cavity 54 is defined by a gate die attach pad portion 24(f) and a source die attach pad portion 20(f), and molding material 24.

Figure 11E:
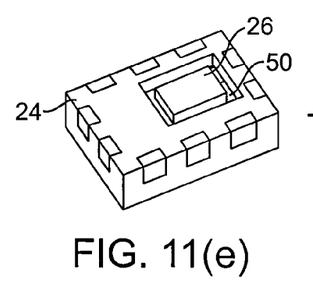

The dimensions of the cavity 54 are larger than the dimensions of the first semiconductor die 26, so that the cavity 54 can receive the first semiconductor die 26. Solder balls 22 are at a front side of the first semiconductor die 26. The bumped first semiconductor die 26 can then be flipped over and mounted on the gate die attach pad portion 24(f) and the source die attach pad portion 20(f), and within the cavity 54 as shown in FIG. 11(e). A standard reflow process can then be performed.

Figure 11F:
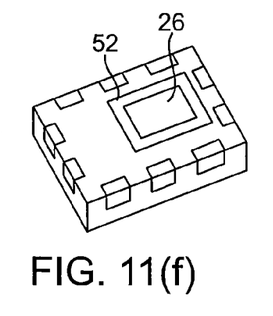

As shown in FIG. 11(f), an insulating material 52 may fill the gap 50 between the first semiconductor die 26 and the surfaces defining the cavity 54. The insulating material may be the same or different than the molding material 24. If it is the same as the molding material, then there can be an interface between the insulating material 52 and the molding material 24, since they were formed at different times.

Figure 12:
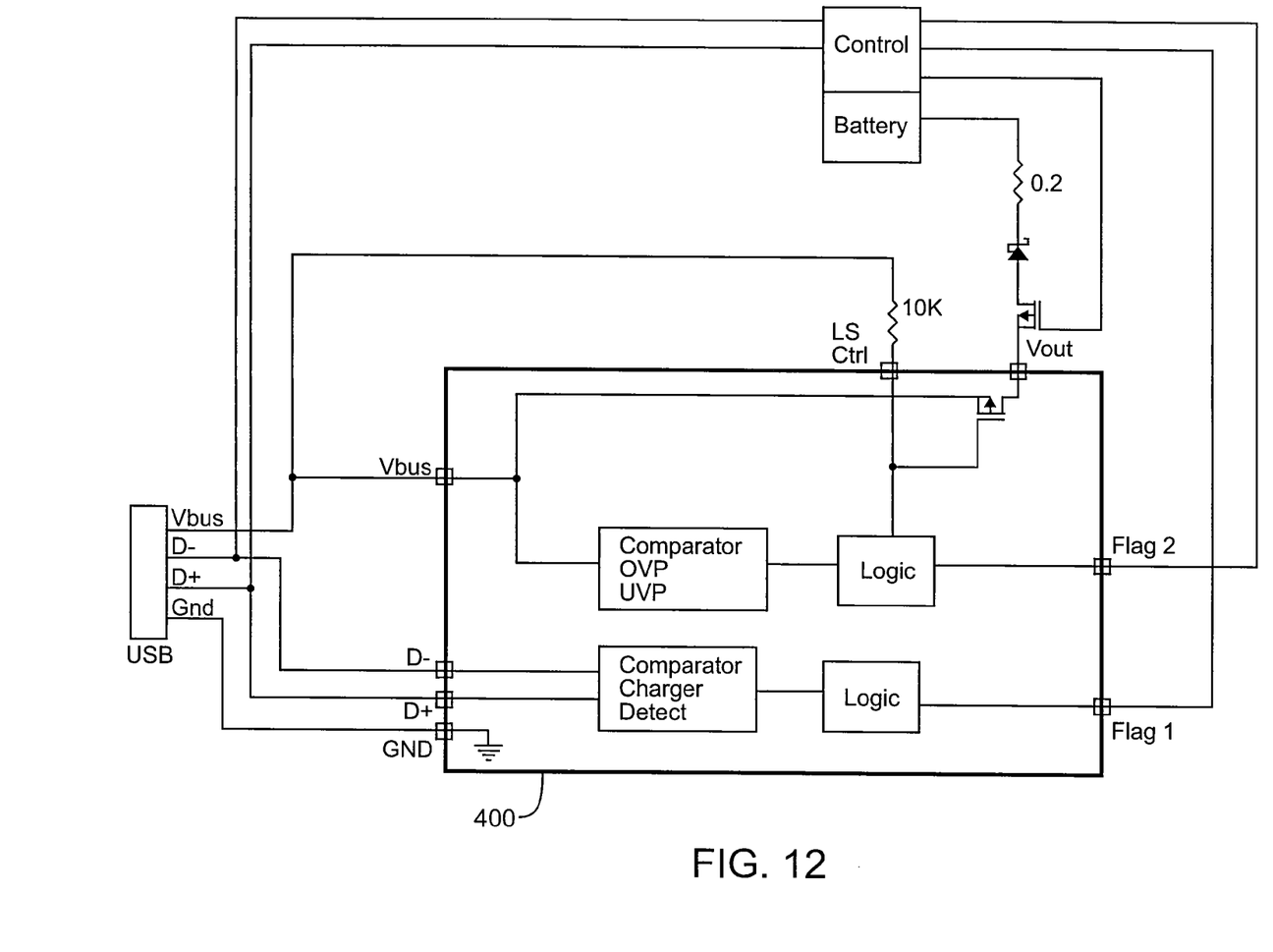
FIGS. 12-13 show circuit diagrams.

FIG. 12 shows a circuit diagram that can be associated with the previously described package. The device 400 may include Vbus over-voltage protection (OVP) and D+/D− connectivity detection in a single package. The device 400 may be a USB connection monitoring device that is used to determine if a standard USB device is connected or a battery charging device is connected. In operation, the device 400 can set the Flag 1 lead to a logic high or low as an indicator to the system controller that a standard USB device or a charger is connected to the USB port. It also monitors Vbus for an over or under voltage condition. The Flag 2 lead can be set low if a condition exists where the Vbus lead is less than 3.3V or greater than 6.0V. The LS (load switch) Control (LS Ctrl) lead can be set high if a condition exists where the Vbus lead is less than 3.3V or greater than 6.0V turning off the PMOS switch.

The terminal connections in the device 400 can be as follows in an exemplary embodiment: Vbus (power connection from a charger or other external power source); D− input (USB data input); D+ input (USB data input); Gnd (device ground pin); Flag 2 (indicates if Vbus is out of voltage range (e.g., 3.3V-6V)); Flag 1 (indicates if D− and D+ are shorted; low: standard USB device; high: charger; standard output drive H=2.5V, L=0.8V).

Figure 13:
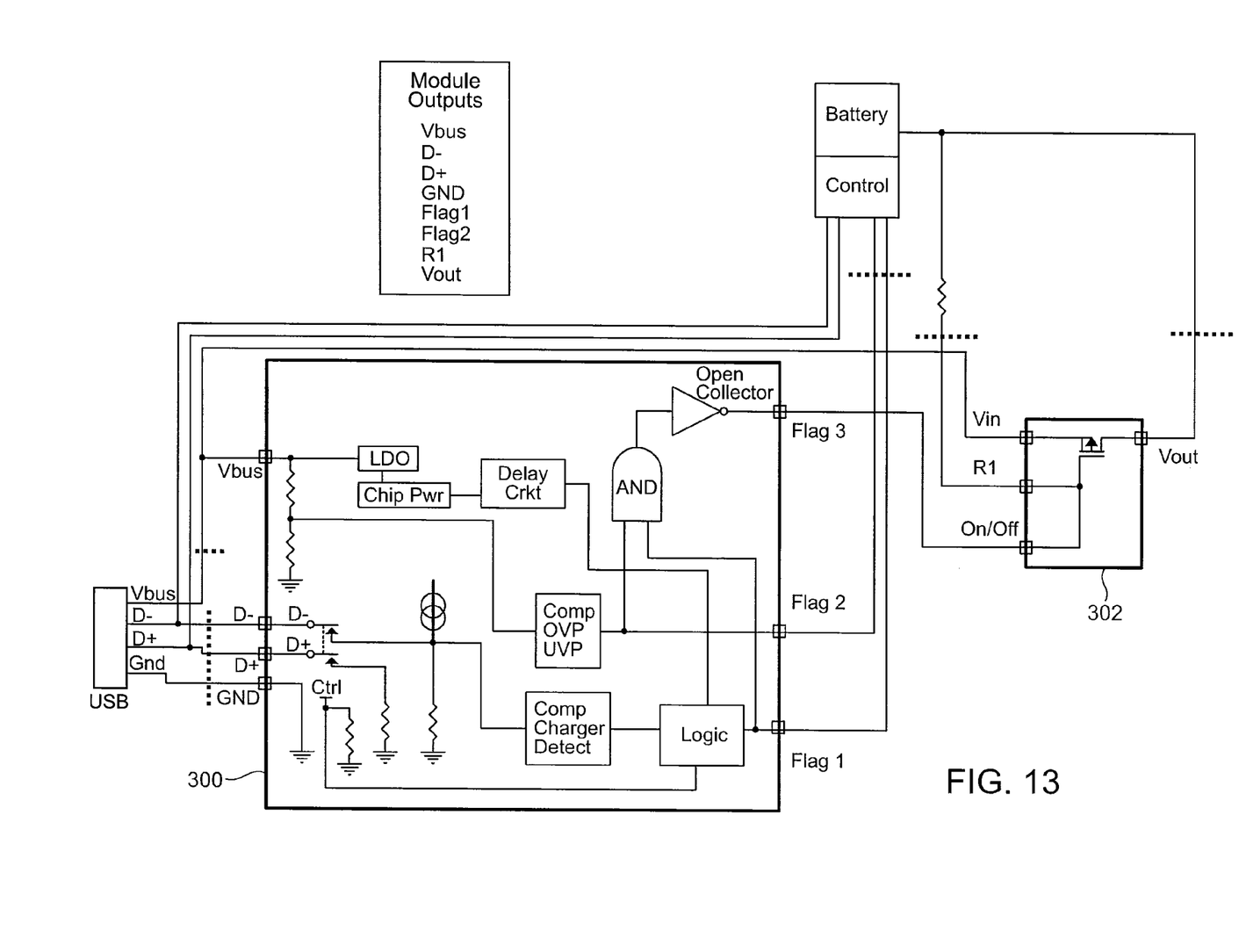

FIG. 13 shows a circuit diagram associated with the previously described package. FIG. 13 shows an integrated circuit die 300 electrically coupled to a power transistor die 302. The discrete device die 302 can be a P-channel power MOSFET die. The integrated circuit die 300 can be a USB connection monitoring device that is configured to determine if a standard USB device is connected or if a battery charging device is connected. Features of the integrated circuit die 300 may include over/under voltage detection, charger/IUSB device detection, and may work with a Vbus supply voltage of 2.7V to 6V. In FIG. 13, dotted lines may show where package lead connections can be provided.

Although specific circuits are shown in FIGS. 12-13, embodiments of the invention are not limited thereto. For example, a package according to an embodiment of the invention could use a first semiconductor die that is a power MOSFET and a second semiconductor die that is an integrated circuit die with a control function that is different than the above-described functions. The package could be used in a power circuit, but need not be used to detect the presence of a USB device.

Embodiments of the invention have advantages. For example, embodiments of the invention are compact, since semiconductor dice can be stacked on each other. In addition, heat is efficiently dissipated in embodiments of the invention, since at least one of the dice in the package is exposed to the external environment. Further, embodiments of the invention can use standard flip chip technology.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, any one or more features of any embodiment of the invention may be combined with any one or more other features of any other embodiment of the invention, without departing from the scope of the invention. For example, although a semiconductor die package with two dice are shown, other embodiments of the invention may include more than two semiconductor dice within a single semiconductor die package.

All patent applications, patents and publications noted above are herein incorporated by reference in their entirety for all purposes. None is admitted to be prior art.

What is claimed is:

1. A semiconductor die package comprising:
a leadframe structure;
a first semiconductor die comprising a first surface attached to a first side of the leadframe structure;
a second semiconductor die attached to a second side of the leadframe structure, wherein the second semiconductor die comprises an integrated circuit die; and
a housing material formed over at least a portion of the leadframe structure, and protecting the first semiconductor die and the second semiconductor die, wherein the first surface of the semiconductor die is exposed through the molding material.

2. The semiconductor die package of claim 1 wherein the first semiconductor die comprises edges, and wherein the housing material further comprises a cavity defined by walls, wherein the first semiconductor die is disposed within the cavity and the walls are spaced from the edges of the first die.

3. The semiconductor die package of claim 1 wherein a region between the edges of the first die and the walls defining the cavity is filled with an insulating material.

4. The semiconductor die package of claim 1 wherein the housing material is a molding material.

5. The semiconductor die package of claim 1 wherein the leadframe structure comprises a die attach pad and leads, wherein the leads extend away from the die attach pad.

6. The semiconductor die package of claim 1 wherein the first semiconductor die comprises a power transistor.

7. The semiconductor die package of claim 1 wherein the first semiconductor die comprises a vertical power MOSFET.

8. The semiconductor die package of claim 1 wherein the second semiconductor die comprises an integrated circuit die.

9. The semiconductor die package of claim 1 wherein the semiconductor die package is configured to provide over-voltage protection and USB connectivity detection.

10. A semiconductor die package comprising:
a first semiconductor die comprising a power transistor; and
a second semiconductor die comprising an integrated circuit, the first semiconductor die configured to detect a USB device,
wherein the first semiconductor die and the second semiconductor die are stacked within the semiconductor die package.

11. A method comprising:
obtaining a leadframe structure;
attaching a first semiconductor die comprising a first surface to a first side of the leadframe structure;
attaching a second semiconductor die to a second side of the leadframe structure, wherein the second semiconductor die comprises an integrated circuit die; and
forming a housing material over at least a portion of the leadframe structure, and protecting the first semiconductor die, and the second semiconductor die, the first surface of the semiconductor die is exposed through the molding material.

12. The method of claim 1 wherein the first semiconductor die comprises edges, and wherein the housing material further comprises a cavity defined by walls, wherein the first semiconductor die is disposed within the cavity and the walls are spaced from the edges of the first die.

13. The method of claim 11 wherein a region between the edges of the first die and the walls defining the cavity is filled with an insulating material.

14. The method of claim 11 wherein the housing material is a molding material.

15. The method of claim 11 wherein the leadframe structure comprises a die attach pad and leads, wherein the leads extend away from the die attach pad.

16. The method of claim 11 wherein the first semiconductor die comprises a power transistor.

17. The method of claim 11 wherein the first semiconductor die comprises a vertical power MOSFET.

18. The method of claim 11 wherein the second semiconductor die comprises an integrated circuit die.

19. The method of claim 11 wherein the semiconductor die package is configured to provide over-voltage protection and USB connectivity detection.

20. A method for making semiconductor die package, the method comprising:
obtaining a first semiconductor die comprising a power transistor; and
stacking a second semiconductor die comprising an integrated circuit on the first semiconductor die, the second semiconductor die being configured to detect a USB device.

* * * * *